(12) United States Patent
Miyazato

(10) Patent No.: US 11,824,093 B2
(45) Date of Patent: Nov. 21, 2023

(54) SILICON CARBIDE SEMICONDUCTOR DEVICE

(71) Applicant: FUJI ELECTRIC CO., LTD., Kawasaki (JP)

(72) Inventor: Masaki Miyazato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 140 days.

(21) Appl. No.: 17/463,020

(22) Filed: Aug. 31, 2021

(65) Prior Publication Data
US 2022/0109049 A1 Apr. 7, 2022

(30) Foreign Application Priority Data

Oct. 5, 2020 (JP) .................. 2020-168495

(51) Int. Cl.
*H01L 29/10* (2006.01)
*H01L 29/78* (2006.01)
(Continued)

(52) U.S. Cl.
CPC ........ *H01L 29/105* (2013.01); *H01L 29/1045* (2013.01); *H01L 29/7805* (2013.01);
(Continued)

(58) Field of Classification Search
CPC ............ H01L 29/105; H01L 29/1045; H01L 29/7805; H01L 29/7813; H01L 29/1608; H01L 29/167; H01L 29/7397; H01L 29/0623; H01L 29/0878; H01L 29/1095; H01L 29/66068; H01L 29/0696; H01L 29/66325; H01L 29/66333–66348; H01L 21/823487; H01L 29/66666; H01L 29/66712–66734; H01L 29/7802–7815; H01L 29/7827–7828; H01L 29/78642;
(Continued)

(56) References Cited

U.S. PATENT DOCUMENTS

2013/0105889 A1* 5/2013 Fujiwara ............. H01L 29/0878
438/270
2019/0103462 A1 4/2019 Matsunaga

FOREIGN PATENT DOCUMENTS

JP 2019067982 A 4/2019

* cited by examiner

*Primary Examiner* — Cuong B Nguyen
(74) *Attorney, Agent, or Firm* — Rabin & Berdo, P.C.

(57) ABSTRACT

A silicon carbide semiconductor device includes silicon carbide semiconductor substrate of a first conductivity type, a first semiconductor layer of the first conductivity type, a second semiconductor layer of the first conductivity type, a third semiconductor layer of a second conductivity type, a first semiconductor region of the first conductivity type, a trench, a gate insulating film, a gate electrode, and an interlayer insulating film. The first semiconductor layer and the second semiconductor layer constitute a first-conductivity-type semiconductor layer and in a deep region of the first-conductivity-type semiconductor layer at least 1 μm from an interface with the third semiconductor layer, a maximum value of a concentration of aluminum is less than $3.0 \times 10^{13}/cm^3$. In the deep region of the first-conductivity-type semiconductor layer, a maximum value of a concentration of boron is less than $1.0 \times 10^{14}/cm^3$.

5 Claims, 11 Drawing Sheets

(51) Int. Cl.
   *H01L 29/16* (2006.01)
   *H01L 29/167* (2006.01)
(52) U.S. Cl.
   CPC ........ *H01L 29/7813* (2013.01); *H01L 29/167* (2013.01); *H01L 29/1608* (2013.01)
(58) Field of Classification Search
   CPC .................. H01L 51/057; H01L 29/7812; H01L 29/7824
   See application file for complete search history.

FIG.10

|  | B | | Al | |
|---|---|---|---|---|
|  | CONVENTIONAL | SECOND EMBODIMENT | CONVENTIONAL | SECOND EMBODIMENT |
| AVERAGE VALUE | 1.4E+14 | 6.3E+12 | 2.6E+13 | 1.0E+13 |
| MAXIMUM VALUE | 2.2E+14 | 1.7E+13 | 6.2E+13 | 2.0E+13 |
| MINIMUM VALUE | 8.0E+13 | 4.2E+12 | 1.0E+13 | 9.5E+12 |
| $\sigma$ | 2.7E+13 | 3.3E+12 | 1.3E+13 | 1.8E+12 |
| MAXIMUM VALUE− MINIMUM VALUE | 1.4E+14 | 1.3E+13 | 5.1E+13 | 1.0E+13 |

FIG.11

|  | EVALUATION DEPTH | CONVENTIONAL | FIRST EMBODIMENT | SECOND EMBODIMENT |
|---|---|---|---|---|
| MAJORITY CARRIER LIFETIME [μs] BY μPCD MEASUREMENT | 1.2μm | 0.30 | 0.80 | 0.60 |
| MINORITY CARRIER LIFETIME [ns] BY TRPL MEASUREMENT | 48μm | 256 | 504 | 522 |
| DEFECT DENSITY OF $Z_{1/2}$ CENTER [/cm$^3$] BY DLTS MEASUREMENT | 3.7μm | 1.24E+14 | 4.70E+13 | 5.26E+13 |

FIG.13

| | EVALUATION DEPTH | CONVENTIONAL | FIRST EMBODIMENT | SECOND EMBODIMENT |
|---|---|---|---|---|
| REVERSE RECOVERY ACCUMULATED CHARGE AMOUNT Qrr [μC] | 10μm | 0.172 | 0.188 | 0.225 |

FIG.14

| SUBSTRATE TYPE | CARRIER LIFETIME | DEFECT DENSITY |
|---|---|---|
| CONVENTIONAL | × | × |
| FIRST EMBODIMENT (LOW B AND Al CONCENTRATIONS) | △ | ○ |
| SECOND EMBODIMENT (LOW B AND Al CONCENTRATIONS + HIGH-CONCENTRATION BUFFER LAYER) | ○ | ○ |

SILICON CARBIDE SEMICONDUCTOR DEVICE

CROSS REFERENCE TO RELATED APPLICATIONS

This application is based upon and claims the benefit of priority of the prior Japanese Patent Application No. 2020-168495, filed on Oct. 5, 2020, the entire contents of which are incorporated herein by reference.

BACKGROUND OF THE INVENTION

1. Field of the Invention

Embodiments of the invention relate to a silicon carbide semiconductor device.

2. Description of the Related Art

Silicon carbide (SiC) is expected as a next generation semiconductor material to replace silicon (Si). Compared to a conventional semiconductor device element using silicon as a semiconductor material, a semiconductor device element using silicon carbide as a semiconductor material (hereinafter, silicon carbide semiconductor device) has various advantages such as enabling resistance of a device element in an ON state to be reduced to a few hundredths and application under higher temperature (at least 200 degrees C.) environments. These advantages are due to characteristics of the material itself in that a band gap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

FIG. 15 is a cross-sectional view depicting a structure of a silicon carbide semiconductor base of a conventional silicon carbide semiconductor device. In a silicon carbide semiconductor base 118, an $n^+$-type buffer layer 120, an $n^-$-type silicon carbide epitaxial layer 102 having an impurity concentration of about $8\times10^{15}/cm^3$, and a p-type base layer 106 are sequentially stacked on a front surface of an $n^+$-type silicon carbide substrate 101 that has an impurity concentration of about $5\times10^{18}/cm^3$.

A vertical MOSFET having a trench gate structure has MOS gates of the trench gate structure in the silicon carbide semiconductor base 118. The MOS gates of the trench gate structure are configured by the p-type base layer 106, $n^+$-type source regions (not depicted), $p^+$-type contact regions (not depicted), trenches (not depicted), gate insulating films (not depicted), and gate electrodes (not depicted). The $p^+$-type contact regions may be omitted. Further, a source electrode in contact with the $n^+$-type source regions and the $p^+$-type contact regions is provided. A back electrode constituting a drain electrode is provided on a back surface of the $n^+$-type silicon carbide substrate 101.

The vertical MOSFET having such a structure has a built-in parasitic pn diode formed by the p-type base layer 106 and the $n^-$-type silicon carbide epitaxial layer 102, as a body diode between a source and drain. The parasitic pn diode may be operated by an application of high potential to the source electrode, and current flows in a direction from the $p^+$-type contact regions, through the p-type base layer 106 and the $n^-$-type silicon carbide epitaxial layer 102, to the $n^+$-type silicon carbide substrate 101. In this manner, in the MOSFET, unlike in an IGBT, a parasitic pn diode is built in and therefore, a freewheeling diode (FWD) used for an inverter may be omitted, contributing to lower cost and reductions in size. Hereinafter, the parasitic pn diode of a MOSFET is referred to as a built-in diode.

Here, holes (positive holes) that are minority carriers are present in the $p^+$-type contact regions, and electrons are present in the $n^+$-type silicon carbide substrate 101 and the $n^-$-type silicon carbide epitaxial layer 102. Therefore, when current passes through the built-in diode, holes are injected from the $p^+$-type contact regions, and recombination of the holes and electrons in the type silicon carbide epitaxial layer 102 or the $n^+$-type silicon carbide substrate 101 occurs. At this time, when defects are present in the crystal of the $n^+$-type silicon carbide substrate 101, basal plane dislocations (BPDs) that are one type of crystal defect present in the $n^+$-type silicon carbide substrate 101 move due to generated recombining energy (3 eV) equivalent to the band gap, and a single Shockley stacking fault (1SSF) sandwiched between two basal dislocations expands.

When the stacking fault expands, the stacking fault does not easily pass current and therefore, ON resistance of the MOSFET and forward voltage of the built-in diode increase. When such operation continues, expansion of the stacking fault is cumulative and therefore, loss occurring in an inverter circuit increases over time and the amount of generated heat also increases, causing device failure.

Thus, as depicted in FIG. 15, the $n^+$-type buffer layer 120 is provided between the $n^-$-type silicon carbide epitaxial layer 102 and the $n^+$-type silicon carbide substrate 101. Formation of a highly doped layer such as the $n^+$-type buffer layer 120 that is doped with, for example, nitrogen (N) at a high concentration of about $1\times10^{18}/cm^3$ and that has a film thickness of about 1 μm introduces lifetime killers, encourages recombination of the holes from the type silicon carbide epitaxial layer 102, controls the concentration of holes reaching the $n^+$-type silicon carbide substrate 101, and suppresses the occurrence of stacking faults and expansion of an arithmetic area thereof.

Further, a silicon carbide semiconductor device is commonly known that can suppress decrease of minority carriers (holes) of an $n^-$-type drift region during bipolar operation (during forward operation of a diode); in the silicon carbide semiconductor device, auto-doping of boron into an $n^-$-type drift region is suppressed and the concentration of boron in the $n^-$-type drift region is sufficiently lower than the n-type impurity concentration and is set to be, for example, not more than about $1\times10^{14}/cm^3$ (refer to Japanese Laid-Open Patent Publication No. 2019-67982).

SUMMARY OF THE INVENTION

According to an embodiment of the invention, a silicon carbide semiconductor device includes a silicon carbide semiconductor substrate of a first conductivity type, having a first main surface and a second main surface opposite to each other; a first semiconductor layer of the first conductivity type, provided on the first main surface of the silicon carbide semiconductor substrate, the first semiconductor layer having an impurity concentration lower than an impurity concentration of the silicon carbide semiconductor substrate and a first surface and a second surface opposite to each other, the second surface of the first semiconductor layer facing the silicon carbide semiconductor substrate; a second semiconductor layer of the first conductivity type, provided on the first surface of the first semiconductor layer, the second semiconductor layer having a first surface and a second surface opposite to each other, the second surface of the second semiconductor layer facing the silicon carbide semiconductor substrate; a third semiconductor layer of a second conductivity type, provided on the first surface of the second semiconductor layer, the third semiconductor layer having a first surface and a second surface opposite to each other, the second surface of the third semiconductor layer facing the silicon carbide semiconductor substrate; a first semiconductor region of the first conductivity type, selectively provided in the third semiconductor layer, at the first surface of the third semiconductor layer; a gate electrode provided, via a gate insulating film, in at least a portion of a surface of the third semiconductor layer positioned between the first semiconductor region and the second semiconductor layer; a first electrode provided on the first surface of the third semiconductor layer and a surface of the first semiconductor region; and a second electrode provided on the second main surface of the silicon carbide semiconductor substrate. The first semiconductor layer and the second semiconductor layer constitute a first-conductivity-type semiconductor layer, and in a deep region of the first-conductivity-type semiconductor layer at least 1 μm from an interface between the first-conductivity-type semiconductor layer and the third semiconductor layer, a maximum value of a concentration of aluminum is less than $3.0 \times 10^{13}/cm^3$. In the deep region of the first-conductivity-type semiconductor layer, a maximum value of a concentration of boron is less than $1.0 \times 10^{14}/cm^3$.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 10 is a table showing Al and B concentrations of the silicon carbide semiconductor device according to the second embodiment and the conventional silicon carbide semiconductor device.

FIG. 11 is a table showing majority carrier lifetime, minority carrier lifetime, and defect density for the silicon carbide semiconductor devices according to the first and the second embodiments and the conventional silicon carbide semiconductor device.

FIG. 13 is a table showing reverse recovery characteristics of the silicon carbide semiconductor devices according to the first and the second embodiments and the conventional silicon carbide semiconductor device.

FIG. 14 is a table showing analysis results for the silicon carbide semiconductor devices according to the first and the second embodiments and the conventional silicon carbide semiconductor device.

DETAILED DESCRIPTION OF THE INVENTION

Figure 1:
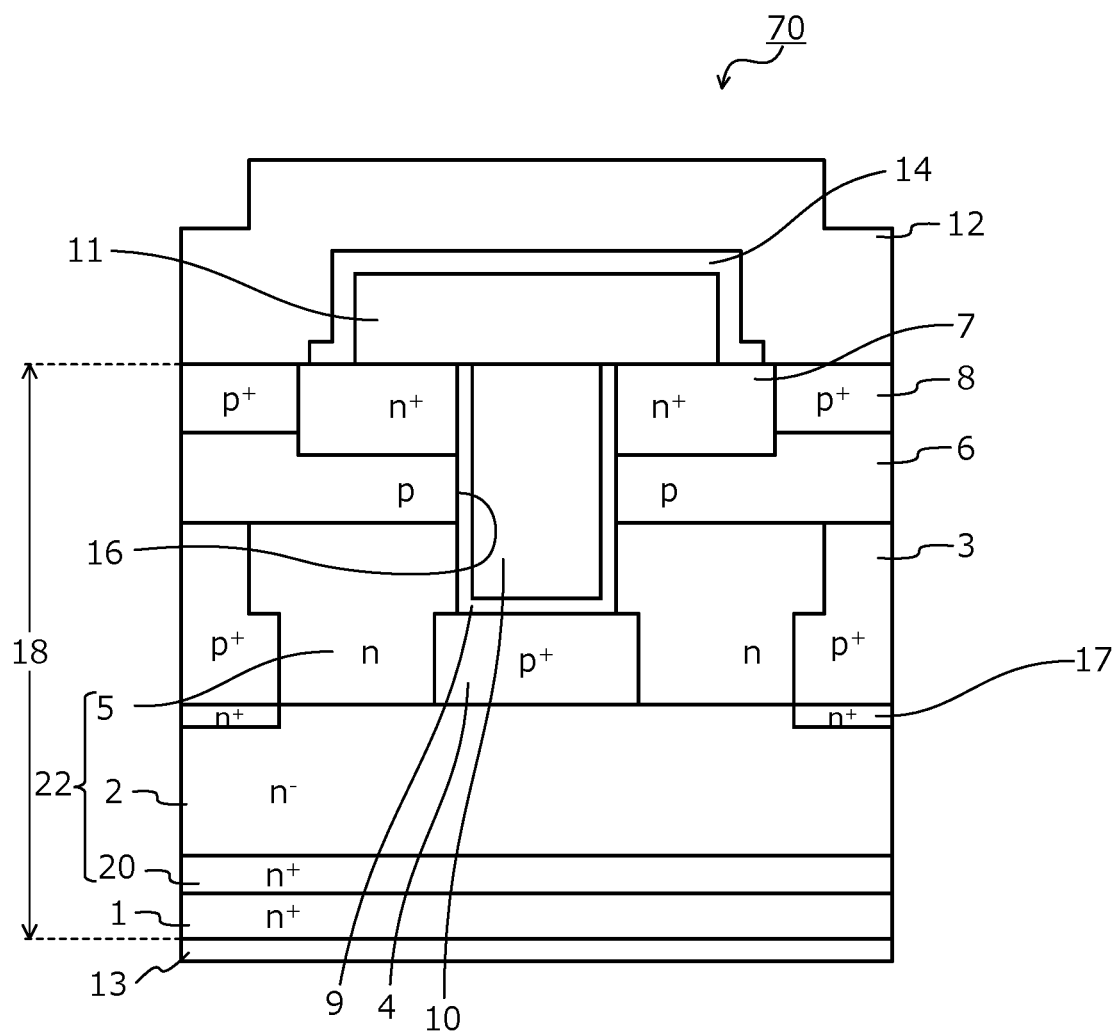
FIG. 1 is a cross-sectional view depicting a structure of a silicon carbide semiconductor device according to a first embodiment.

First, problems associated with the conventional techniques are discussed. In the silicon carbide semiconductor base 118, results of deep level transient spectroscopy (DLTS) measurement indicate that defect density is high in the n⁻-type silicon carbide epitaxial layer 102 and the n⁺-type buffer layer 120 about 5 μm from the front surface of the n⁺-type silicon carbide substrate 101. As a result, the lifetime of minority carriers (holes) and the lifetime of majority carriers (electrons) are short.

In this manner, in the conventional silicon carbide semiconductor base 118, defect density is not controlled and therefore, there is variation of defect density in the n⁻-type silicon carbide epitaxial layer 102 and the n⁺-type buffer layer 120. Thus, a problem arises in that for each device element, a carrier lifetime specific thereto, cannot be controlled by particle beam irradiation, etc. In particular, a problem arises in that variation occurs in reverse recovery characteristics dependent on defects and carrier lifetime.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention is configured using a wide band gap semiconductor. In a first embodiment, a silicon carbide semiconductor device fabricated (manufactured) using, for example, silicon carbide (SiC) as a wide band gap semiconductor is described taking a trench-type MOSFET 70 as an example. FIG. 1 is a cross-sectional view depicting a structure of a silicon carbide semiconductor device according to the first embodiment. In FIG. 1, only an active region through which a main current of the trench-type MOSFET 70 flows is depicted.

As depicted in FIG. 1, the silicon carbide semiconductor device according to the first embodiment is configured using a silicon carbide semiconductor base 18 in which, on a first main surface (front surface), for example, a (0001)-plane (Si-face) of an n$^+$-type silicon carbide substrate (silicon carbide semiconductor substrate of a first conductivity type) 1, having an impurity concentration of about $5 \times 10^{18}/cm^3$, an n$^+$-type buffer layer (first semiconductor layer of the first conductivity type) 20, an n$^-$-type silicon carbide epitaxial layer (second semiconductor layer of the first conductivity type) 2, and a p-type base layer (third semiconductor layer of a second conductivity type) 6 are sequentially stacked.

In the n$^-$-type silicon carbide epitaxial layer 2, at a first surface thereof opposite to a second surface thereof facing the n$^+$-type silicon carbide substrate 1, an n-type high-concentration region 5 may be provided. The n-type high-concentration region 5 is a high-concentration n-type drift layer having an impurity concentration lower than that of the n$^+$-type silicon carbide substrate 1 but higher than that of the n$^-$-type silicon carbide epitaxial layer 2.

The n$^+$-type buffer layer 20, for example, is a highly doped layer having a film thickness in a range from 1 μm to 5 μm and doped with nitrogen at a high concentration in a range from $1 \times 10^{17}/cm^3$ to $1 \times 10^{18}/cm^3$. The n$^+$-type buffer layer 20 encourages recombination of holes from the n$^-$-type silicon carbide epitaxial layer 2, controls the concentration of the holes reaching the n$^+$-type silicon carbide semiconductor substrate 1, and suppresses the occurrence of stacking faults and expansion of an arithmetic area thereof.

The n$^-$-type silicon carbide epitaxial layer 2, for example, is a low-concentration drift layer doped with nitrogen at a concentration of about $8 \times 10^{15}/cm^3$.

In a conventional n-type epitaxial layer (the n$^-$-type silicon carbide epitaxial layer 102 and the n$^+$-type buffer layer 120), in a profile along a film-thickness direction, a maximum value of a concentration of aluminum (Al) is at least $2.0 \times 10^{13}/cm^3$ and a maximum value of a concentration of boron (B) is at least $1.0 \times 10^{14}/cm^3$.

In contrast, in an n-type epitaxial layer (first-conductivity-type semiconductor layer) 22 of the first embodiment, in a profile along the film-thickness direction, in a deep region (hereinafter, deep region) at least 1 μm from an interface with the p-type base layer 6, the maximum value of the concentration of Al is less than $3.0 \times 10^{13}/cm^3$ and the maximum value of the concentration of B is less than $1.0 \times 10^{14}/cm^3$. Preferably, in the deep region, the maximum value of the concentration of Al may be less than $2.0 \times 10^{13}/cm^3$. The n-type epitaxial layer 22 includes the n$^-$-type silicon carbide epitaxial layer 2 and the n$^+$-type buffer layer 20, and in an instance in which the n-type high-concentration region 5 is provided, further includes the n-type high-concentration region 5. Here, the p-type base layer 6 is ion implanted with Al and B during formation and therefore, a region shallower than 1 μm from an interface with the p-type base layer 6 is affected by this ion implantation. Therefore, even when the concentrations of Al and B of the n-type epitaxial layer 22 are set low as described above, in regions shallower than 1 μm from the interface with the p-type base layer 6, the concentrations of Al and B are higher than the values above.

For example, the n-type epitaxial layer 22 is formed by epitaxial growth as described hereinafter. At this time, by lowering the concentrations of Al and B in epitaxial growth apparatus, the n-type epitaxial layer 22 of the first embodiment may be formed. Further, formation of the n-type epitaxial layer 22 of the first embodiment may include measuring the concentrations of Al and B after the n-type epitaxial layer 22 is formed to identify only those satisfying the ranges described above.

Further, in the deep region of the n-type epitaxial layer 22, preferably, a difference of the maximum value of the concentration of Al minus the minimum value of the concentration of Al may be less than $3.0 \times 10^{13}/cm^3$; and a difference of the maximum value of the concentration of boron minus the minimum value of the concentration of boron may be less than $3.0 \times 10^{13}/cm^3$.

In this manner, in the first embodiment, the concentrations of Al and B in the n-type epitaxial layer 22 are set low like the values described above. As a result, defect densities of a $Z_{1/2}$ center and an $EH_{6/7}$ center by DLTS measurement are low. The $Z_{1/2}$ center and the $EH_{6/7}$ center are typical deep levels observed in n-type silicon carbide.

Therefore, the carrier lifetime of the n$^-$-type silicon carbide epitaxial layer 2 constituting a drift layer is long. For example, the lifetime of majority carriers at room temperature (about 25 degrees C.) is at least 0.5 μs as measured by a microwave photo conductivity decay (μPCD) method, and the lifetime of minority carriers at room temperature as measured by a time resolved photo luminescence (TRPL) method is at least 500 ns.

Here, to fabricate a high-performance SiC bipolar device with ultrahigh breakdown voltage of 10 kV, a carrier lifetime of at least about 5 μs is necessary, and the silicon carbide semiconductor base 18 of the first embodiment is effective for the high-performance SiC bipolar device with ultrahigh breakdown voltage of 10 kV. Further, in the first embodiment, by increasing the carrier lifetime, variation of the carrier lifetime may be suppressed. Thus, for each device element, the carrier lifetime specific thereto may be controlled by particle beam irradiation, etc.

Further, a back electrode (second electrode) 13 constituting a drain electrode is provided on a second main surface (back surface, i.e., back surface of the silicon carbide semiconductor base 18) of the n$^+$-type silicon carbide substrate 1. On a surface of the back electrode 13, a drain electrode pad (not depicted) is provided.

In the silicon carbide semiconductor base 18, at a first main surface thereof (side having the p-type base layer 6), a trench structure is formed. In particular, a trench 16 penetrates through the p-type base layer 6 from a first surface of the p-type base layer 6 opposite to a second surface thereof facing the n$^+$-type silicon carbide substrate 1 (the first main surface of the silicon carbide semiconductor base 18) and reaches the n-type high-concentration region 5 (in an instance in which the n-type high-concentration region 5 is not provided, the trench 16 reaches the n$^-$-type silicon carbide epitaxial layer 2, hereinafter, indicated as simply "(2)"). Along an inner wall of the trench 16, a gate insulating film 9 is formed along a bottom and sidewalls of the trench 16, and a gate electrode 10 is formed on the gate insulating film 9 in the trench 16. The gate electrode 10 is insulated from the n-type high-concentration region 5 (2) and the p-type base layer 6 by the gate insulating film 9. A portion of the gate electrode 10 may protrude toward a later-described source electrode 12, from a top of the trench 16 (side where the source electrode 12 is provided).

In the n-type high-concentration region 5 (2), at a first surface thereof opposite to a second surface thereof facing the n+-type silicon carbide substrate 1 (first main surface side of the silicon carbide semiconductor base 18), first p+-type base regions 3 are provided between the trench 16 and trenches 16 adjacent thereto. Further, in the n-type high-concentration region 5 (2), a second p+-type base region 4 in contact with the bottom of the trench 16 is provided. The second p+-type base region 4 is disposed at a position facing the bottom of the trench 16 in a depth direction (direction from the source electrode 12 to the drain electrode 13). A width of the second p+-type base region 4 is equal to or wider than a width of the trench 16. The bottom of the trench 16 may reach the second p+-type base region 4 or may be positioned in the n-type high-concentration region 5 (2), between the p-type base layer 6 and the second p+-type base region 4.

Further, in the n−-type silicon carbide epitaxial layer 2, n+-type regions 17 each having a peak impurity concentration higher than that of the n-type high-concentration region 5 (2) are provided at positions deeper than are positions of the first p+-type base regions 3 between the trench 16 and the trenches 16 adjacent thereto. A deep position is a position closer to the back electrode 13 than are the first p+-type base regions 3.

In the silicon carbide semiconductor base 18, at the first main surface thereof, an n+-type source region (first semiconductor region of the first conductivity type) 7 is selectively provided in the p-type base layer 6. Further, p+-type contact regions 8 may be selectively provided. Further, the n+-type source region 7 and the p+-type contact regions 8 are in contact with each other.

An interlayer insulating film 11 is provided in an entire area of the first main surface of the silicon carbide semiconductor base 18, so as to cover the gate electrode 10 embedded in the trench 16. The source electrode (first electrode) 12 is in contact with the n+-type source region 7 and the p-type base layer 6 via contact holes opened in the interlayer insulating film 11. Further, in an instance in which the p+-type contact regions 8 are provided, the source electrode 12 is in contact with the n+-type source region 7 and the p+-type contact regions 8. The source electrode 12 is electrically insulated from the gate electrode 10 by the interlayer insulating film 11. On the source electrode 12, a source pad (not depicted) is provided. Between the source electrode 12 and the interlayer insulating film 11, for example, a barrier metal 14 that prevents diffusion of metal atoms from the source electrode 12 to the gate electrode 10 may be provided.

Next, a method of manufacturing the silicon carbide semiconductor device according to the first embodiment is described. FIGS. 2, 3, 4, 5, and 6 are cross-sectional views depicting states of the silicon carbide semiconductor device according to the first embodiment during manufacture.

First, the n+-type silicon carbide substrate 1 containing an n-type silicon carbide is prepared. The n+-type silicon carbide substrate 1 has an impurity concentration of, for example, about $5.0\times10^{18}/cm^3$. Further, on the first main surface of the n+-type silicon carbide substrate 1, the n+-type buffer layer 20 containing silicon carbide is epitaxially grown to a thickness, for example, in a range from 1 μm to 5 μm, while being doped with an n-type impurity, for example, nitrogen atoms (N). An impurity concentration of the n+-type buffer layer 20, for example, may be set so as to be in a range from $1.0\times10^{17}/cm^3$ to $1.0\times10^{18}/cm^3$.

Figure 2:
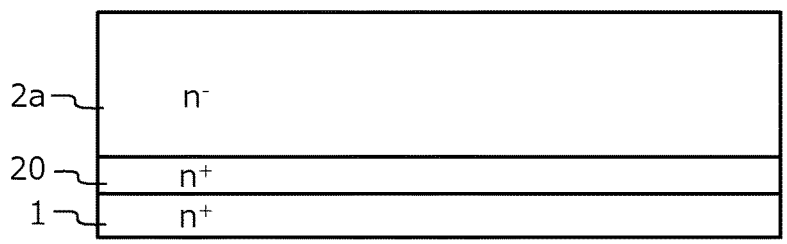
FIG. 2 is a cross-sectional view depicting a state of the silicon carbide semiconductor device according to the first embodiment during manufacture.

Next, on the surface of the n+-type buffer layer 20, a lower n−-type silicon carbide epitaxial layer 2a is epitaxially grown to a thickness of, for example, about 30 μm, while being doped with an n-type impurity, for example, nitrogen atoms (N). An impurity concentration of the lower n−-type silicon carbide epitaxial layer 2a may be set so as to be about $8\times10^{15}/cm^3$. The state up to here is depicted in FIG. 2.

Next, on the surface of the lower n−-type silicon carbide epitaxial layer 2a, a non-depicted mask having desired openings is formed by a photolithographic technique, for example, using an oxide film. Subsequently, by ion implantation using the oxide film as a mask, an n-type impurity, for example, nitrogen atoms may be ion implanted. As a result, the n+-type regions 17 are formed in the lower n−-type silicon carbide epitaxial layer 2a.

Next, the mask used during the ion implantation for forming the n+-type regions 17 is removed. Next, a mask having predetermined openings is formed by a photolithographic technique, for example, using an oxide film. Subsequently, a p-type impurity such as aluminum is ion implanted, forming lower first p+-type base regions 3a and the second p+-type base region 4 of a depth of about 0.5 μm. In an instance in which the n+-type regions 17 are formed, on a first surface of each of the n+-type regions 17, opposite to a second surface thereof facing the n+-type silicon carbide substrate 1, the lower first p+-type base regions 3a are formed so as to overlap the n+-type regions 17.

Figure 3:
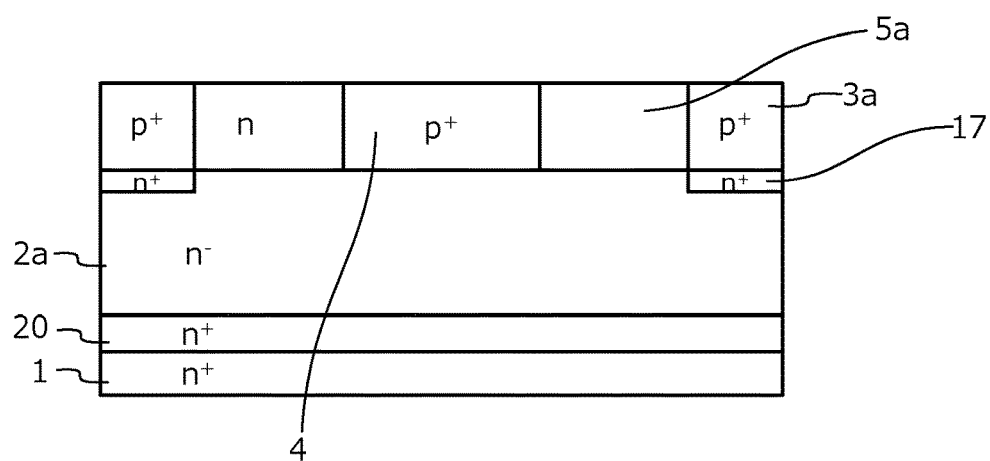
FIG. 3 is a cross-sectional view depicting a state of the silicon carbide semiconductor device according to the first embodiment during manufacture.

Next, portions of the ion implantation mask are removed and an n-type impurity such as nitrogen is ion implanted in the openings, whereby lower n-type high-concentration regions 5a of a depth of, for example, about 0.5 μm may be formed in portions of the lower n−-type silicon carbide epitaxial layer 2a, at the surface of the lower n−-type silicon carbide epitaxial layer 2a. An impurity concentration of the lower n-type high-concentration regions 5a may be set to be, for example, about $1\times10^{17}/cm^3$. The state up to here is depicted in FIG. 3.

Next, on the surface of the lower n−-type silicon carbide epitaxial layer 2a, an upper n−-type silicon carbide epitaxial layer 2b having a thickness of about 0.5 μm and doped with an n-type impurity such as nitrogen is formed. An impurity concentration of the upper n−-type silicon carbide epitaxial layer 2b is set so as to be about $8\times10^{15}/cm^3$. Hereinafter, the lower n−-type silicon carbide epitaxial layer 2a and the upper n−-type silicon carbide epitaxial layer 2b combined are the n−-type silicon carbide epitaxial layer 2.

Next, on the surface of the upper n−-type silicon carbide epitaxial layer 2b, an ion implantation mask having predetermined openings is formed by photolithography using, for example, an oxide film. Subsequently, a p-type impurity such as aluminum is ion implanted in the openings of the oxide film, forming upper first p+-type base regions 3b of a depth of about 0.5 μm, so as to overlap the lower first p+-type base regions 3a. The upper first p+-type base regions 3b and the lower first p+-type base regions 3a form respective continuous regions that are the first p+-type base regions 3. An impurity concentration of the upper first p+-type base regions 3b is set so as to be, for example, about $5\times10^{18}/cm^3$.

Figure 4:
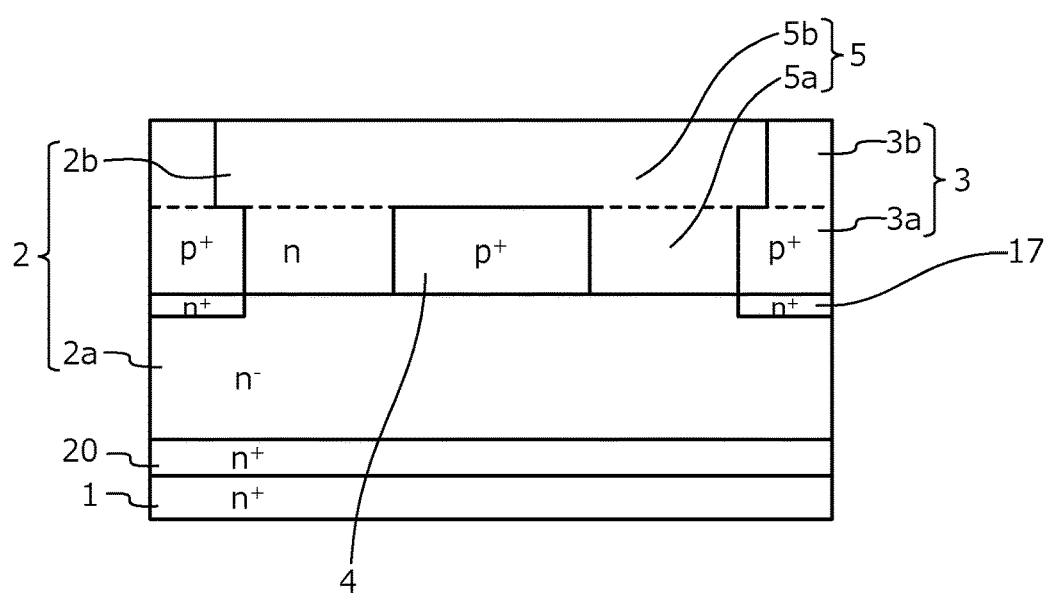
FIG. 4 is a cross-sectional view depicting a state of the silicon carbide semiconductor device according to the first embodiment during manufacture.

Next, portions of the ion implantation mask are removed, an n-type impurity such as nitrogen is ion implanted in the openings, whereby an upper n-type high-concentration region 5b of a depth of, for example, about 0.5 μm may be formed in portions of the n−-type silicon carbide epitaxial layer 2, at the surface of the n−-type silicon carbide epitaxial layer 2. An impurity concentration of the upper n-type high-concentration region 5b is set to be, for example, about $1\times10^{17}/cm^3$. The upper n-type high-concentration region 5b and the lower n-type high-concentration regions 5a are formed so as to at least partially contact each other, thereby forming the n-type high-concentration region 5. Nonetheless, the n-type high-concentration region 5 may be formed in an entire area of the substrate or may be omitted. The state up to here is depicted in FIG. 4.

Next, on the surface of the n⁻-type silicon carbide epitaxial layer 2, the p-type base layer 6 having a thickness of about 1.1 µm is formed by epitaxial growth. An impurity concentration of the p-type base layer 6 is set to be about $4 \times 10^{17}/cm^3$. After the p-type base layer 6 is formed by epitaxial growth, the p-type base layer 6 may be further ion implanted with a p-type impurity such as aluminum.

Next, in the silicon carbide semiconductor base 18, at the first main surface thereof (surface layer of the p-type base layer 6), predetermined regions configuring MOS gates are formed. In particular, on the surface of the p-type base layer 6, an ion implantation mask having predetermined openings is formed by photolithography using, for example, an oxide mask. An n-type impurity such as nitrogen (N), phosphorus (P), etc. is ion implanted in the openings, forming the n⁺-type source region 7 in portions of the p-type base layer 6, at the surface of the p-type base layer 6. Next, the ion implantation mask used in forming the n⁺-type source region 7 is removed and by a similar method, an ion implantation mask having predetermined openings is formed, a p-type impurity such as boron is ion implanted in portions of the p-type base layer 6, at the surface of the p-type base layer 6, whereby the p⁺-type contact regions 8 may be formed. An impurity concentration of the p⁺-type contact regions 8 is set to be higher than the impurity concentration of the p-type base layer 6.

Figure 5:
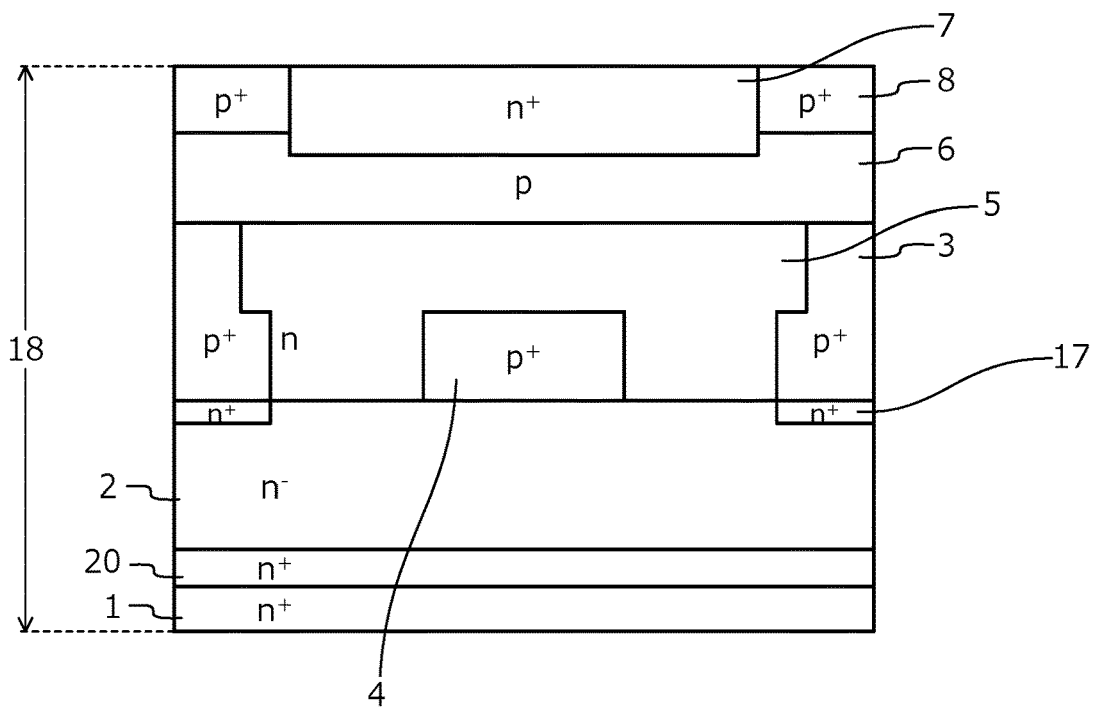
FIG. 5 is a cross-sectional view depicting a state of the silicon carbide semiconductor device according to the first embodiment during manufacture.

Next, a heat treatment (activation annealing) for activating all regions formed by ion implantation is performed. For example, a heat treatment (annealing) under an inert gas atmosphere of about 1700 degrees C. is performed, thereby implementing an activation process for the first p⁺-type base regions 3, the second p⁺-type base region 4, the n⁺-type source region 7, the p⁺-type contact regions 8, and the n⁺-type regions 17. As described above, ion implanted regions may be collectively activated by a single session of the heat treatment or may be activated by performing the heat treatment each time ion implantation is performed. The state up to here is depicted in FIG. 5.

Next, on the surface of the p-type base layer 6, a trench formation mask having predetermined openings is formed by photolithography using, for example, an oxide film. Next, by dry etching, the trench 16 penetrating through the p-type base layer 6 and reaching the n-type high-concentration region 5 (2) is formed. The bottom of the trench 16 may reach the second p⁺-type base region 4 formed in the n-type high-concentration region 5 (2). Next, the trench formation mask is removed.

Figure 6:
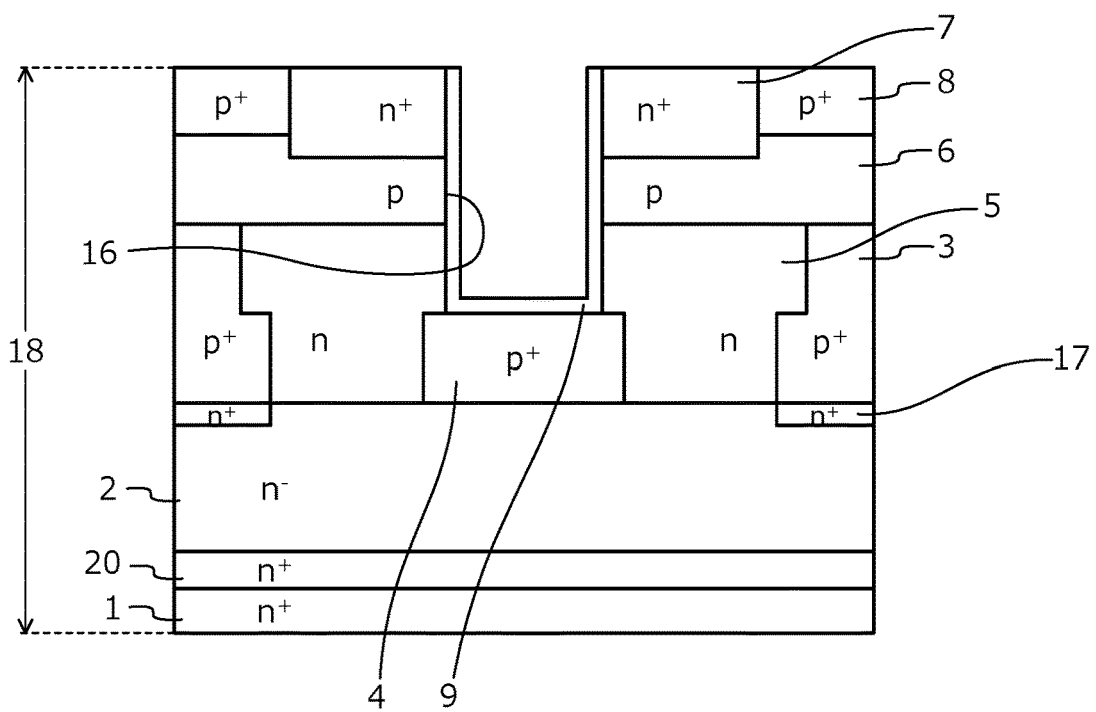
FIG. 6 is a cross-sectional view depicting a state of the silicon carbide semiconductor device according to the first embodiment during manufacture.

Next, along the surfaces of the n⁺-type source region 7 and the p⁺-type contact regions 8 and along the bottom and sidewalls of each trench 16, the gate insulating film 9 is formed. The gate insulating film 9 may be formed by thermal oxidation of a temperature of about 1000 degrees C. under an oxygen atmosphere. Further, the gate insulating film 9 may be formed by a deposition method by a chemical reaction such as that for a high temperature oxide (HTO). The state up to here is depicted in FIG. 6.

Next, a polycrystalline silicon layer doped with, for example, phosphorus atoms is provided on the gate insulating film 9. The polycrystalline silicon layer may be formed so as to be embedded in the trench 16. The polycrystalline silicon layer is patterned by photolithography so as to be left in the trench 16, forming the gate electrode 10 therein.

Next, for example, phosphate glass is deposited so as to cover the gate insulating film 9 and the gate electrode 10 and have a thickness of about 1 µm, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating film 9 are patterned by photolithography, thereby forming contact holes therein that expose the n⁺-type source region 7 and the p⁺-type contact regions 8. Thereafter, a heat treatment (reflow) is performed, planarizing the interlayer insulating film 11.

Next, the interlayer insulating film 11 is selectively removed, and a nickel (Ni) or Ti film is deposited on the surface of the silicon carbide semiconductor base 18. Next, the surface is protected, and a Ni or Ti film is deposited on the back surface of the n⁺-type silicon carbide substrate 1. Next, a heat treatment of about 1000 degrees C. is performed, forming an ohmic electrode on the surface of the silicon carbide semiconductor base 18 and on the back surface of the n⁺-type silicon carbide substrate 1.

Next, a conductive film constituting the source electrode 12 is provided on the interlayer insulating film 11 and so as to be in contact with ohmic electrode portions formed in the contact holes, thereby putting the n⁺-type source region 7 and the p⁺-type contact regions 8 in contact with the source electrode 12.

Next, on the second main surface of the n⁺-type silicon carbide substrate 1, the back electrode 13 constituted by, for example, a nickel (Ni) film is formed. Thereafter, for example, a heat treatment of a temperature of about 970 degrees C. is performed, forming an ohmic contact between the n⁺-type silicon carbide substrate 1 and the back electrode 13.

Next, for example, by a sputtering method, on the source electrode 12 of the front surface of the silicon carbide semiconductor base 18 and in openings of the interlayer insulating film 11, an electrode pad constituting the source pad (not depicted) is deposited. A thickness of a portion of the electrode pad on the interlayer insulating film 11 may be, for example, about 5 µm. The electrode pad, for example, may be formed by aluminum containing silicon at a rate of 1% (Al—Si). Next, the source pad is selectively removed.

Next, on the surface of the back electrode 13, as the drain electrode pad (not depicted), for example, titanium (Ti), nickel (Ni), and gold (Au) are sequentially deposited. Thus, as described, the silicon carbide semiconductor device depicted in FIG. 1 is completed.

As described above, according to the first embodiment, in the deep region of the n-type epitaxial layer, in a profile along the film-thickness direction, the maximum value of the concentration of Al is less than $3.0 \times 10^{13}/cm^3$ and the maximum value of the concentration of B is less than $1.0 \times 10^{14}/cm^3$. As a result, the carrier lifetime of the n⁻-type silicon carbide epitaxial layer constituting a drift layer is increased. Therefore, application to a high-performance SiC bipolar device with ultrahigh breakdown voltage of 10 kV is possible. Further, carrier lifetime variation may be suppressed, thus, for each device element, the carrier lifetime specific thereto may be controlled by particle beam irradiation, etc.

Figure 7:
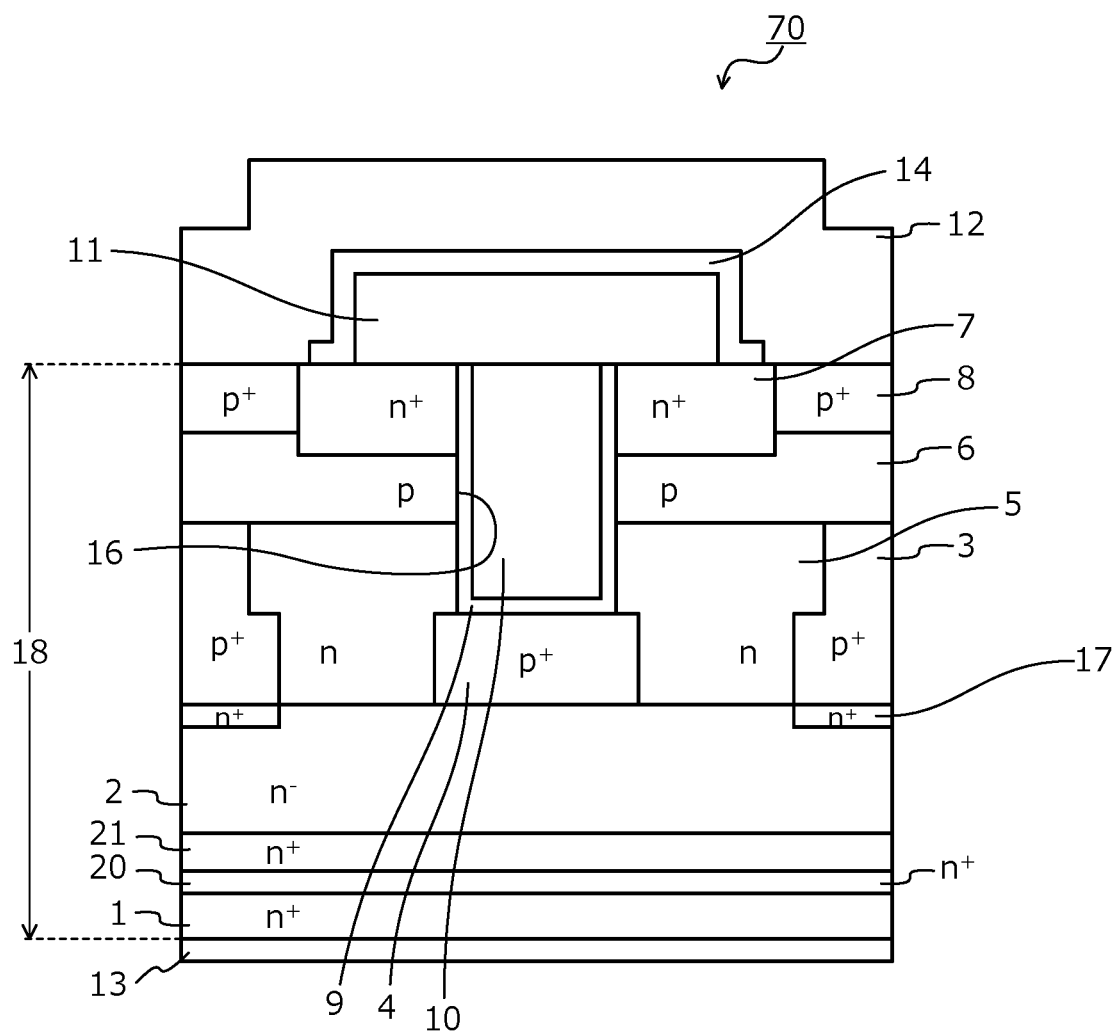
FIG. 7 is a cross-sectional view depicting a structure of a silicon carbide semiconductor device according to a second embodiment.

FIG. 7 is a cross-sectional view depicting a structure of a silicon carbide semiconductor device according to a second embodiment. The silicon carbide semiconductor device according to the second embodiment differs from the silicon carbide semiconductor device according to the first embodiment in that between the n⁺-type buffer layer 20 and the n⁻-type silicon carbide epitaxial layer 2, an n⁺-type high-concentration buffer layer (fourth semiconductor layer of the first conductivity type) 21 is provided.

A thickness and an impurity concentration of the n⁺-type high-concentration buffer layer 21 are greater than the thickness and the impurity concentration of the n⁺-type buffer layer 20. For example, a film thickness of the n⁺-type high-concentration buffer layer 21 is at least 3 times a film thickness of the n⁺-type buffer layer 20 and the impurity concentration of the n⁺-type high-concentration buffer layer 21 is at least 3 times the impurity concentration of the n⁺-type buffer layer 20. Further, the n⁺-type high-concentration buffer layer 21, in a profile along the film-thickness direction, a maximum value of the concentration of Al is less than $3.0 \times 10^{13}/cm^3$ and a maximum value of the concentration of B is less than $1.0 \times 10^{14}/cm^3$, similarly to the n⁺-type buffer layer 20 and the n⁻-type silicon carbide epitaxial layer 2. Preferably, the maximum value of the concentration of Al of the n⁺-type high-concentration buffer layer 21 may be less than $2.0 \times 10^{14}/cm^3$. As a result, in the second embodiment as well, similarly to the first embodiment, defect densities of the $Z_{1/2}$ center and the $EH_{6/7}$ center by DLTS measurement are low.

Figure 8:
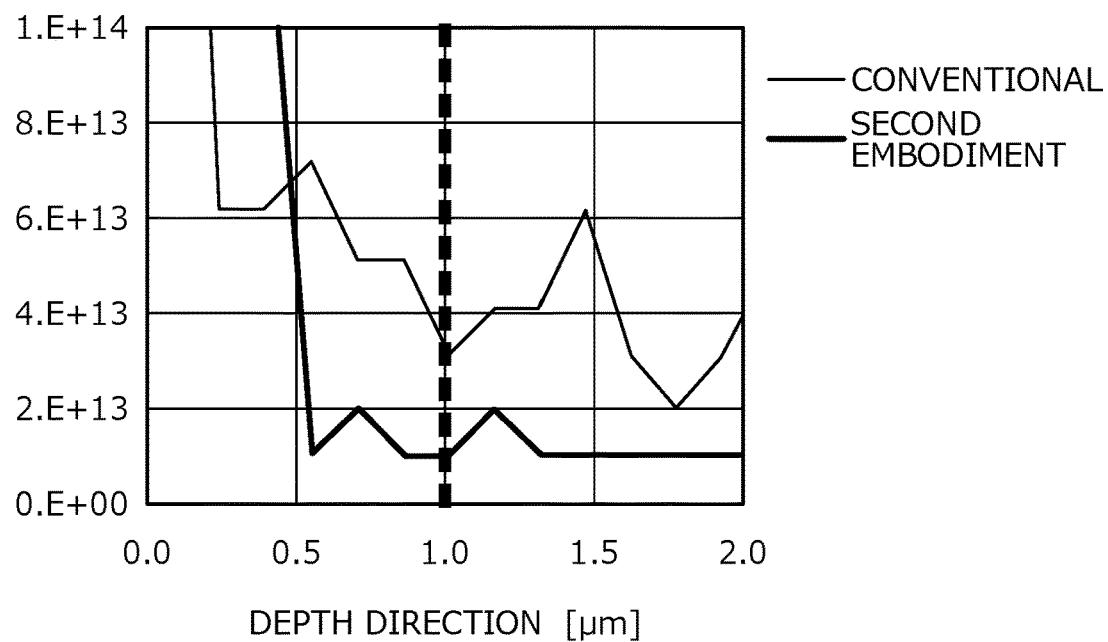
FIG. 8 is a graph showing Al concentrations of the silicon carbide semiconductor device according to the second embodiment and a conventional silicon carbide semiconductor device.

Here, FIG. 8 is a graph showing Al concentrations of the silicon carbide semiconductor device according to the second embodiment and the conventional silicon carbide semiconductor device. In FIG. 8, a vertical axis indicates Al concentration in units of/cm³. Further, a horizontal axis indicates depth from an interface between the n⁻-type silicon carbide epitaxial layer 2 and the p-type base layer 6 (in an instance in which the n-type high-concentration region 5 is provided, an interface between the n-type high-concentration region 5 and the p-type base layer 6, hereinafter, referred to as "P/N interface") in units of μm. FIG. 8 shows measurement results obtained by secondary ion mass spectrometry (SIMS).

As depicted in FIG. 8, a region shallower than 1 μm from the P/N interface (side toward origin from dotted line in FIG. 8) is affected by the Al when the p-type base layer 6 is formed and has a high concentration of Al. On the other hand, in a deep region at least 1 μm from the P/N interface (side of the dotted line opposite to the origin in FIG. 8), in the conventional silicon carbide semiconductor base 118, the maximum value of the concentration of Al is about $6.0 \times 10^{13}/cm^3$ whereas in the silicon carbide semiconductor base 18 of the second embodiment, the maximum value of the concentration of Al is less than $2.0 \times 10^{13}/cm^3$. In the silicon carbide semiconductor base 18 of the first embodiment as well, results for the concentration of Al are similar to those in FIG. 8.

Figure 9:
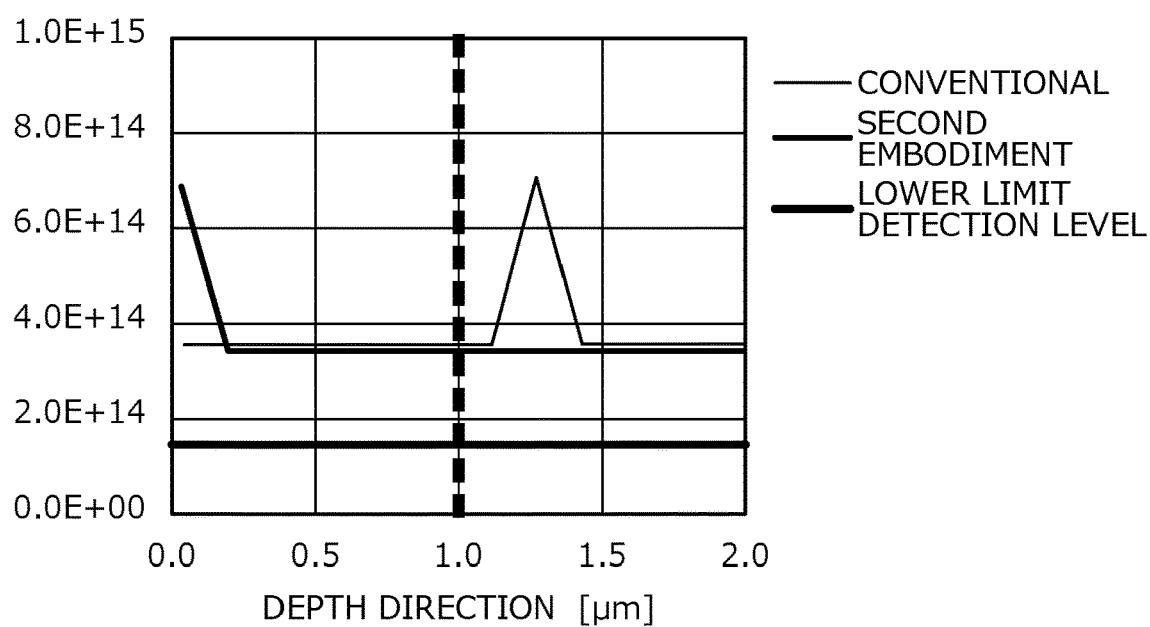
FIG. 9 is a graph showing B concentrations of the silicon carbide semiconductor device according to the second embodiment and the conventional silicon carbide semiconductor device.

Further, FIG. 9 is a graph showing B concentrations of the silicon carbide semiconductor device according to the second embodiment and the conventional silicon carbide semiconductor device. In FIG. 9, a vertical axis indicates the concentration of B in units of/cm³. Further, a horizontal axis indicates depth from the P/N interface in units of μm. FIG. 9 shows measurement results obtained by SIMS.

As depicted in FIG. 9, a region shallower than 1 μm from the P/N interface is affected by B when the p-type base layer 6 is formed and has a high concentration of B. On the other hand, in a deep region at least 1 μm from the P/N interface, the maximum value of the concentration of B is about $6.0 \times 10^{14}/cm^3$ in the conventional silicon carbide semiconductor base 118, whereas the maximum value of the concentration of B is less than $1.0 \times 10^{14}/cm^3$ in the silicon carbide semiconductor base 18 of the second embodiment.

In the silicon carbide semiconductor base 18 of the first embodiment as well, results for the concentration of B are similar to those in FIG. 9.

FIG. 10 is a table showing Al and B concentrations of the silicon carbide semiconductor device according to the second embodiment and the conventional silicon carbide semiconductor device. FIG. 10 collectively shows the SIMS measurement results of FIGS. 8 and 9, including average values of the concentrations of Al and B, the maximum values, the minimum values, standard deviation, and the difference of the maximum value–the minimum value, for the second embodiment and the conventional silicon carbide semiconductor device.

As depicted in FIG. 10, for the conventional concentration of B, the difference of the maximum value minus the minimum value (maximum value–minimum value) is a large value of $1.4 \times 10^{14}/cm^3$; however, for the concentration of B in the second embodiment, the difference of the maximum value minus the minimum value is a small value of $1.3 \times 10^{13}/cm^3$. Similarly, for the conventional concentration of Al, the difference of the maximum value minus the minimum value is a large value of $5.1 \times 10^{13}/cm^3$; however, for the concentration of Al in the second embodiment, the difference of the maximum value minus the minimum value is a small value of $1.0 \times 10^{13}/cm^3$. In other words, in the second embodiment, an absolute value of the difference of the maximum value minus the minimum value is smaller than that for the conventional silicon carbide semiconductor device and thus, the amount of impurity is small. Therefore, a width of variation with respect to the absolute value is smaller for the second embodiment than for the conventional silicon carbide semiconductor device.

FIG. 11 is a table showing majority carrier lifetime, minority carrier lifetime, and defect density for the silicon carbide semiconductor devices according to the first and the second embodiments and the conventional silicon carbide semiconductor device. In FIG. 11, averages of multiple measurements are shown. In FIG. 11, evaluation depth is a depth of a position where the majority carrier lifetime, the minority carrier lifetime, and the defect density are measured, the depth being from the P/N interface.

As depicted in FIG. 11, both majority carriers and minority carriers have lifetimes that are longer in the first and the second embodiments than that conventionally, and both are longer in the second embodiment than in the first embodiment. In the first and the second embodiments, the lifetime of majority carriers is at least 0.5 μs and the lifetime of minority carriers is at least 500 ns. Further, for the majority carriers, the average value is not more than 1.0 μs and the maximum value is also not more than 1.0 μs.

Further, as depicted in FIG. 11, the defect density of the $Z_{1/2}$ center is lower in the first and the second embodiments than that conventionally. While not depicted in FIG. 11, the defect density of the $EH_{6/7}$ center is also lower in the first and the second embodiments than that conventionally. In this manner, in the first and the second embodiments in which the concentrations of Al and B of the n-type epitaxial layer 22 are low, while the defect density is low, a difference due to the n⁺-type high-concentration buffer layer 21 is small.

Figure 12:
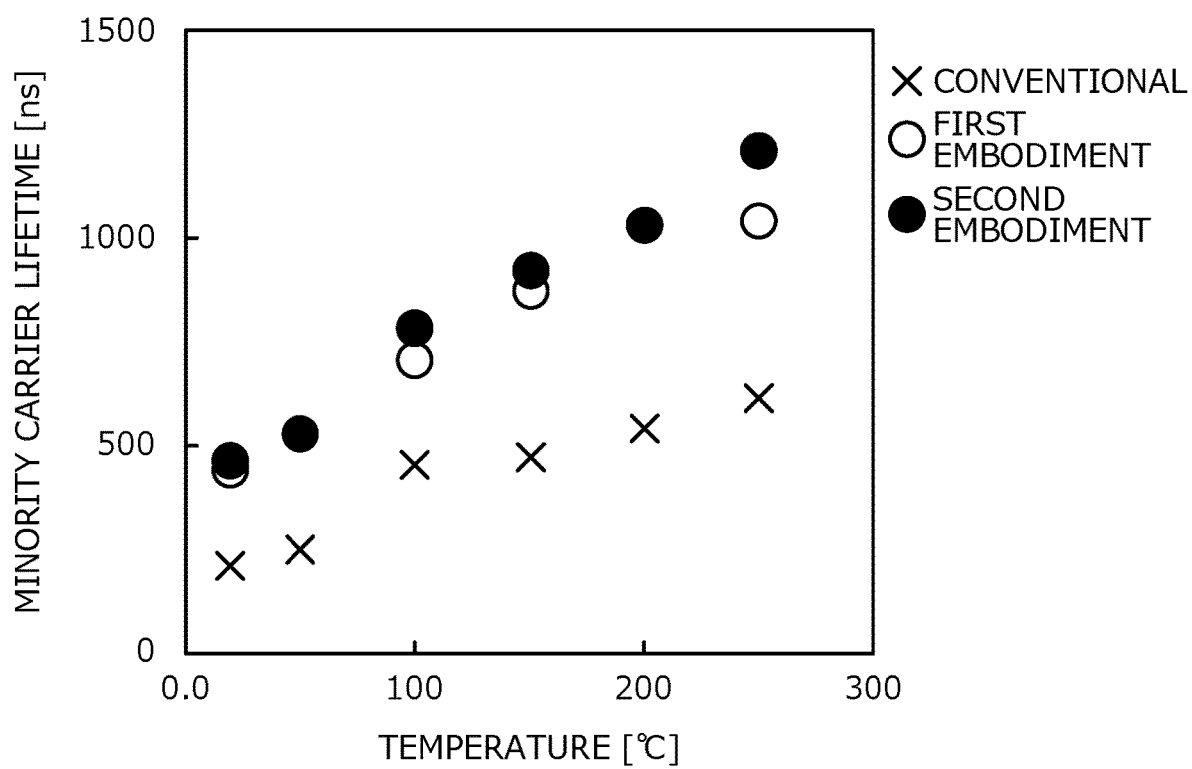
FIG. 12 is a graph showing measurement results of minority carrier lifetime for the silicon carbide semiconductor devices according to the first and the second embodiments and the conventional silicon carbide semiconductor device.
Figure 15:
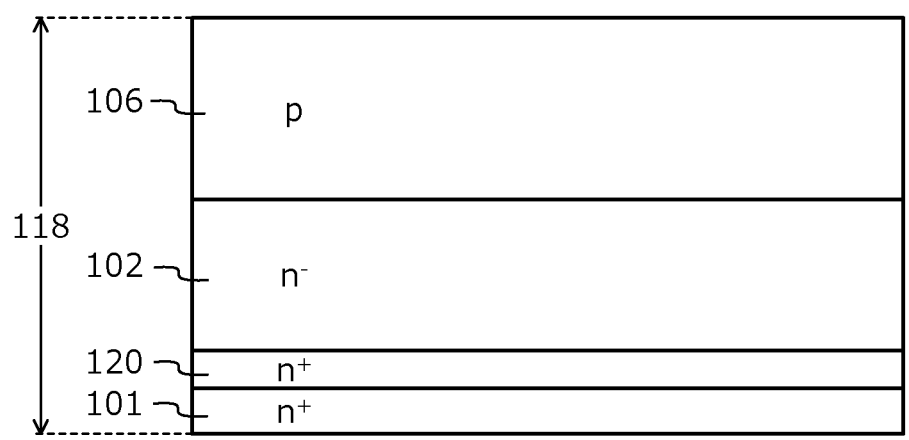
FIG. 15 is a cross-sectional view depicting a structure of a silicon carbide semiconductor base of the conventional silicon carbide semiconductor device.

FIG. 12 is a graph showing measurement results of minority carrier lifetime for the silicon carbide semiconductor devices according to the first and the second embodiments and the conventional silicon carbide semiconductor device. In FIG. 12, a vertical axis indicates the lifetime of minority carriers in units of ns. Further, a horizontal axis indicates temperature in units of degrees C. FIG. 12 shows results of measurement of the lifetime of minority carriers in the n⁻-type silicon carbide epitaxial layer 2 by TRPL.

As depicted in FIG. 12, the lifetime of minority carriers is longer in the first and the second embodiments than that conventionally, in all temperature ranges and is longer in the second embodiment than in the first embodiment, in a region for which the temperature is at least 100 degrees C. In this manner, in the first and the second embodiments in which the concentrations of Al and B in the n-type epitaxial layer 22 are low, the lifetime of minority carriers is long, and when the n⁺-type high-concentration buffer layer 21 is provided like in the second embodiment, the lifetime of minority carriers is further increased.

FIG. 13 is a table showing reverse recovery characteristics of the silicon carbide semiconductor devices according to the first and the second embodiments and the conventional silicon carbide semiconductor device. In FIG. 13, reverse recovery accumulated charge amount Qrr is shown as reverse recovery characteristics. The evaluation depth is the depth (from the P/N interface) of the position where the reverse recovery accumulated charge amount Qrr is measured.

As depicted in FIG. 13, the reverse recovery accumulated charge amount Qrr is greater in the first and the second embodiments than that conventionally and greater in the second embodiment than in the first embodiment. In this manner, in the first and the second embodiments having low concentrations of Al and B in the n-type epitaxial layer 22, the reverse recovery characteristics improve and similarly to the second embodiment, when the n⁺-type high-concentration buffer layer 21 is provided, the reverse recovery characteristics further improve.

FIG. 14 is a table showing analysis results for the silicon carbide semiconductor devices according to the first and the second embodiments and the conventional silicon carbide semiconductor device. FIG. 14 is a table collectively showing analysis results shown in FIGS. 8 to 13. As depicted in FIG. 14, the concentrations of Al and B in the n-type epitaxial layer 22 is reduced, whereby the defect density decreases, and the lifetime of the majority carriers and the lifetime of minority carriers increase. Further, the n⁺-type high-concentration buffer layer 21 is provided, whereby the lifetime of majority carriers and the lifetime of minority carriers further increase.

In the second embodiment, the n⁺-type high-concentration buffer layer 21 is provided, whereby the n⁺-type high-concentration buffer layer 21, to reduce a probability of capturing carriers of the interface, may increase the majority carrier lifetime and the minority carrier lifetime to be longer than those of the first embodiment. Therefore, the silicon carbide semiconductor base 18 of the second embodiment is effective for the high-performance SiC bipolar device with ultrahigh breakdown voltage of 10 kV. Further, in the second embodiment as well, the carrier lifetime is increased, whereby variation of the carrier lifetime may be suppressed. Therefore, for each device element, the carrier lifetime specific thereto may be controlled by particle beam irradiation, etc.

Next, a method of manufacturing the silicon carbide semiconductor device according to the second embodiment is described. First, similarly to the first embodiment, on the surface of the n⁺-type silicon carbide substrate 1, the n⁺-type buffer layer 20 is formed. Next, on the surface of the n⁺-type buffer layer 20, the n⁺-type high-concentration buffer layer 21 is epitaxially grown while being doped with an n-type impurity such as, for example, nitrogen atoms (N). The impurity concentration of the n⁺-type high-concentration buffer layer 21 may be set so as to become, for example, about $8.0 \times 10^{18}/cm^3$.

Next, on the surface of the n⁺-type high-concentration buffer layer 21, the lower n⁻-type silicon carbide epitaxial layer 2a is epitaxially grown to have a thickness of, for example, about 30 μm while being doped with an n-type impurity such as, for example, nitrogen atoms (N). Thereafter, the process of forming the n⁺-type regions 17 in portions of the lower n⁻-type silicon carbide epitaxial layer 2a of the first embodiment and subsequent processes are performed, thereby completing the silicon carbide semiconductor device depicted in FIG. 7.

As described above, according to the second embodiment, the n⁺-type high-concentration layer is provided, whereby the lifetime of majority carriers and the lifetime of minority carriers may be made longer than those of the first embodiment. Therefore, the silicon carbide semiconductor base of the second embodiment is effective for the high-performance SiC bipolar device with ultrahigh breakdown voltage of 10 kV. Further, in the second embodiment as well, the carrier lifetime is lengthened, whereby variation of the carrier lifetime may be suppressed. Therefore, for each device element, the carrier lifetime specific thereto may be controlled by particle beam irradiation, etc.

In the foregoing, various modifications within a range not departing from the spirit of the invention are possible and, for example, in the embodiments described above, dimensions, impurity concentrations, etc. of parts are variously set according to necessary specifications. Further, in the embodiments described above, while a trench-gate-type vertical MOSFET is described as an example, application is further possible to a PiN diode, an insulated gate bipolar transistor (IGBT), etc. Further, in the embodiments, while the first conductivity type is assumed to be an n-type and the second conductivity type is assumed to a p-type, the present invention is similarly implemented when the first conductivity type is a p-type and the second conductivity type is an n-type.

According to the invention described above, in a deep region of the n-type epitaxial layer (the first-conductivity-type semiconductor layer), in a profile along the film-thickness direction, the maximum value of the concentration of Al is less than $3.0 \times 10^{13}/cm^3$ and the maximum value of the concentration of B is less than $1.0 \times 10^{14}/cm^3$. As a result, the carrier lifetime of the n⁻-type silicon carbide epitaxial layer (second semiconductor layer of the first conductivity type) constituting the drift layer is increased. Therefore, application to the high-performance SiC bipolar device with ultrahigh breakdown voltage of 10 kV is possible. Further, carrier lifetime variation may be suppressed, thus, for each device element, the carrier lifetime specific thereto may be controlled by particle beam irradiation, etc. Further, the n⁺-type high-concentration buffer layer (fourth semiconductor layer of the first conductivity type) is provided, whereby the lifetime of majority carriers and the lifetime of minority carriers may be further increased.

According to the silicon carbide semiconductor device of the present invention an effect is achieved in that carrier lifetime variation is suppressed and for each device element, the carrier lifetime specific thereto may be controlled by particle beam irradiation, etc.

As described above, the silicon carbide semiconductor device according to the present invention is useful for power semiconductor devices used in power converting equipment such as inverters, power source devices of various types of industrial machines, igniters of automobiles, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate of a first conductivity type, having a first main surface and a second main surface opposite to each other;
   a first semiconductor layer of the first conductivity type, provided on the first main surface of the silicon carbide semiconductor substrate, the first semiconductor layer having an impurity concentration lower than an impurity concentration of the silicon carbide semiconductor substrate and a first surface and a second surface opposite to each other, the second surface of the first semiconductor layer facing the silicon carbide semiconductor substrate;
   a second semiconductor layer of the first conductivity type, provided on the first surface of the first semiconductor layer, the second semiconductor layer having a first surface and a second surface opposite to each other, the second surface of the second semiconductor layer facing the silicon carbide semiconductor substrate;
   a third semiconductor layer of a second conductivity type, provided on the first surface of the second semiconductor layer, the third semiconductor layer having a first surface and a second surface opposite to each other, the second surface of the third semiconductor layer facing the silicon carbide semiconductor substrate;
   a first semiconductor region of the first conductivity type, selectively provided in the third semiconductor layer, at the first surface of the third semiconductor layer;
   a gate electrode provided, via a gate insulating film, in at least a portion of a surface of the third semiconductor layer positioned between the first semiconductor region and the second semiconductor layer;
   a first electrode provided on the first surface of the third semiconductor layer and a surface of the first semiconductor region; and
   a second electrode provided on the second main surface of the silicon carbide semiconductor substrate, wherein
   the first semiconductor layer and the second semiconductor layer constitute a first-conductivity-type semiconductor layer,
   in a deep region of the first-conductivity-type semiconductor layer at least 1 μm from an interface between the first-conductivity-type semiconductor layer and the third semiconductor layer, a maximum value of a concentration of aluminum is less than $3.0\times10^{13}/cm^3$, and a minimum value of the concentration of aluminum is equal to or higher than $9.5\times10^{12}/cm^3$, and
   in the deep region of the first-conductivity-type semiconductor layer, a maximum value of a concentration of boron is less than $1.0\times10^{14}/cm^3$, and a minimum value of the concentration of boron is equal to or higher than $4.2\times10^{12}/cm^3$.

2. The silicon carbide semiconductor device according to claim 1, wherein
   in the deep region of the first-conductivity-type semiconductor layer, the maximum value of the concentration of aluminum is less than $2.0\times10^{13}/cm^3$.

3. The silicon carbide semiconductor device according to claim 1, wherein
   in the deep region of the first-conductivity-type semiconductor layer, a difference of the maximum value of the concentration of aluminum minus the minimum value of the concentration of aluminum is less than $3.0\times10^{13}/cm^3$, and
   in the deep region of the first-conductivity-type semiconductor layer, a difference of the maximum value of the concentration of boron minus the minimum value of the concentration of boron is less than $3.0\times10^{13}/cm^3$.

4. A silicon carbide semiconductor device, comprising:
   a silicon carbide semiconductor substrate of a first conductivity type, having a first main surface and a second main surface opposite to each other;
   a first semiconductor layer of the first conductivity type, provided on the first main surface of the silicon carbide semiconductor substrate, the first semiconductor layer having an impurity concentration lower than an impurity concentration of the silicon carbide semiconductor substrate and a first surface and a second surface opposite to each other, the second surface of the first semiconductor layer facing the silicon carbide semiconductor substrate;
   a second semiconductor layer of the first conductivity type, provided on the first surface of the first semiconductor layer, the second semiconductor layer having a first surface and a second surface opposite to each other, the second surface of the second semiconductor layer facing the silicon carbide semiconductor substrate;
   a third semiconductor layer of a second conductivity type, provided on the first surface of the second semiconductor layer, the third semiconductor layer having a first surface and a second surface opposite to each other, the second surface of the third semiconductor layer facing the silicon carbide semiconductor substrate;
   a fourth semiconductor layer of the first conductivity type, provided on the first surface of the first semiconductor layer, the fourth semiconductor layer having an impurity concentration higher than the impurity concentration of first semiconductor layer,
   a first semiconductor region of the first conductivity type, selectively provided in the third semiconductor layer, at the first surface of the third semiconductor layer;
   a gate electrode provided, via a gate insulating film, in at least a portion of a surface of the third semiconductor layer positioned between the first semiconductor region and the second semiconductor layer;
   a first electrode provided on the first surface of the third semiconductor layer and a surface of the first semiconductor region; and
   a second electrode provided on the second main surface of the silicon carbide semiconductor substrate, wherein
   the first semiconductor layer and the second semiconductor layer constitute a first-conductivity-type semiconductor layer, and in a deep region of the first-conductivity-type semiconductor layer at least 1 μm from an interface between the first-conductivity-type semiconductor layer and the third semiconductor layer, a maximum value of a concentration of aluminum is less than $3.0\times10^{13}/cm^3$, and
   in the deep region of the first-conductivity-type semiconductor layer, a maximum value of a concentration of boron is less than $1.0\times10^{14}/cm^3$.

5. The silicon carbide semiconductor device according to claim 4, wherein
the impurity concentration of the fourth semiconductor layer is at least 3 times the impurity concentration of the first semiconductor layer, and
the fourth semiconductor layer has a film thickness at least 3 times a film thickness of the first semiconductor layer.

* * * * *